(12) United States Patent
Bullock et al.

(10) Patent No.: US 9,507,145 B2
(45) Date of Patent: Nov. 29, 2016

(54) CONDENSATION INHIBITING LAYER, METHOD OF FORMING THE LAYER, AND CONDENSATION INHIBITING DEVICE

(71) Applicant: LOCKHEED MARTIN CORPORATION, Bethesda, MD (US)

(72) Inventors: Steven E. Bullock, Canton, GA (US); Sarah M. Simon, Baltimore, MD (US); John B. Stetson, Jr., New Hope, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/578,063

(22) Filed: Dec. 19, 2014

(65) Prior Publication Data

US 2015/0177480 A1 Jun. 25, 2015

Related U.S. Application Data

(60) Provisional application No. 61/919,682, filed on Dec. 20, 2013.

(51) Int. Cl.
| | |
|---|---|
| *G02B 27/00* | (2006.01) |
| *H01L 41/09* | (2006.01) |
| *H01L 41/332* | (2013.01) |
| *B08B 7/02* | (2006.01) |
| *H01L 41/193* | (2006.01) |
| *B08B 17/06* | (2006.01) |

(52) U.S. Cl.
CPC ....... *G02B 27/0006* (2013.01); *H01L 41/0986* (2013.01); *H01L 41/332* (2013.01); *B08B 7/02* (2013.01); *B08B 17/065* (2013.01); *H01L 41/193* (2013.01); *Y10T 428/2457* (2015.01)

(58) Field of Classification Search
CPC ...... G02B 7/181; G02B 7/18; H01B 13/003; H01B 13/0026; H01B 13/00
USPC ......................................... 359/512
See application file for complete search history.

(56) References Cited

U.S. PATENT DOCUMENTS

| | | | |
|---|---|---|---|
| 5,376,856 A * | 12/1994 | Takeuchi | H01L 41/0973 310/328 |
| 6,171,420 B1 | 1/2001 | Takahashi et al. | |
| 8,476,805 B2 | 7/2013 | Ohnishi et al. | |
| 2011/0062146 A1 | 3/2011 | Kuriki | |
| 2011/0076417 A1 | 3/2011 | Matsuda et al. | |

FOREIGN PATENT DOCUMENTS

GB 2 426 434 A 11/2006

OTHER PUBLICATIONS

International Search Report dated Apr. 20, 2015.

\* cited by examiner

*Primary Examiner* — Euncha Cherry
(74) *Attorney, Agent, or Firm* — Hamre, Schumann, Mueller & Larson, P.C.

(57) ABSTRACT

A condensation inhibiting layer includes an electrostrictive actuator film, and a treated surface formed on the electrostrictive actuator film and including a plurality of channels.

21 Claims, 16 Drawing Sheets

CONDENSATION INHIBITING LAYER, METHOD OF FORMING THE LAYER, AND CONDENSATION INHIBITING DEVICE

CROSS-REFERENCE TO RELATED APPLICATIONS

This application claims priority to U.S. Provisional Patent Application No. 61/919,682 which was filed on Dec. 20, 2013, and is incorporated by reference herein.

BACKGROUND OF THE INVENTION

1. Field of the Invention

The present invention relates generally to a condensation inhibiting layer and, more particularly, to a condensation inhibiting layer which includes an electrostrictive actuator film.

2. Description of the Related Art

Many conventional devices include surfaces which are desirably free of condensation (e.g., water) and frost. For example, condensation or frost on a surface of a mirror makes it difficult to see a reflection in the mirror, and condensation or frost on a surface of a glass window or door reduces the transparency of the glass window or door. Such conventional devices include, for example, aircraft, automobiles, watercraft, submarines, industrial equipment, farm equipment (e.g., combines), refrigerators (e.g., commercial refrigerators), freezers (e.g., commercial freezers) and building structures (e.g., homes and office buildings), and extending to small products including but not limited to eyeglasses and protective goggles.

FIG. 1 illustrates a conventional device 100 which includes an object 101 (e.g., mirror, window, door) having a surface which should desirably remain free of condensation and frost. A problem may develop when moisture in the air condenses on the surface of the object 101 (e.g., fogging or frosting) resulting in a decrease in the appearance or performance (e.g., transparency) of the object 101. For example, if the surface is exposed to air at a temperature greater than a temperature of the surface, moisture in the air may condense on the surface.

For example, a conventional refrigerator door or freezer door has a problem in that when the door is opened (e.g., especially when opened in a humid environment), moisture in the air will condense on a surface of the door. When the door is closed, the condensation will remain on the surface of the door for a substantial period of time, unless somehow mitigated or removed prior to its natural evaporation. If the refrigerator or freezer is used to store goods for sale such as at a grocery store, a customer's view of the goods through the door may be impeded by the condensation, causing the customer to be discouraged and lose interest in the goods stored in the refrigerator.

Several conventional methods are used to inhibit condensation and frost on surfaces such as a surface of a window or door. For example, the rear window of an automobile may include a wire heating grid which heats the window to inhibit condensation. The windshield of the automobile may include a defroster which blows warm air onto the inner surface of the windshield which warms the windshield to inhibit condensation on the windshield.

Another conventional method is to apply a hydrophobic coating to the surface of the transparent member. Such hydrophobic coatings may include, for example, manganese oxide polystyrene ($MnO_2$/PS) nano-composite, zinc oxide polystyrene (ZnO/PS) nano-composite, precipitated calcium carbonate, carbon nanotube structures, and silica nano-coating.

SUMMARY

In view of the foregoing and other exemplary problems, disadvantages, and drawbacks of the aforementioned conventional devices and methods, an exemplary aspect of the present invention is directed to a condensation inhibiting layer and, more particularly, to a condensation inhibiting layer which includes an electrostrictive actuator film.

An exemplary aspect of the present invention is directed to a condensation inhibiting layer which includes an electrostrictive actuator film, and a treated surface formed on the transparent electrostrictive actuator film, and including a plurality of channels.

Another exemplary aspect of the present invention is directed to a method of forming a condensation inhibiting layer. The method includes forming an electrostrictive actuator film, and treating the electrostrictive actuator film to form a treated surface including a plurality of channels on the electrostrictive actuator film.

Another exemplary aspect of the present invention is directed to a condensation inhibiting device, including a condensation inhibiting layer which includes an electrostrictive actuator film, and a treated surface formed on the electrostrictive actuator film, and including a plurality of channels. The device also includes an electrode which is electrically connected to the condensation inhibiting layer.

With its unique and novel features, the present invention can provide a condensation inhibiting layer and condensation inhibiting device which can reliably attain and maintain the clarity (e.g., transparency) of a surface, and are affordable, scalable, low energy, low maintenance and outgas/discharge/contaminant free.

BRIEF DESCRIPTION OF THE DRAWINGS

The foregoing and other exemplary purposes, aspects and advantages will be better understood from the following detailed description of the embodiments of the invention with reference to the drawings, in which.

DETAILED DESCRIPTION OF THE EXEMPLARY EMBODIMENTS OF THE INVENTION

Figure 1:
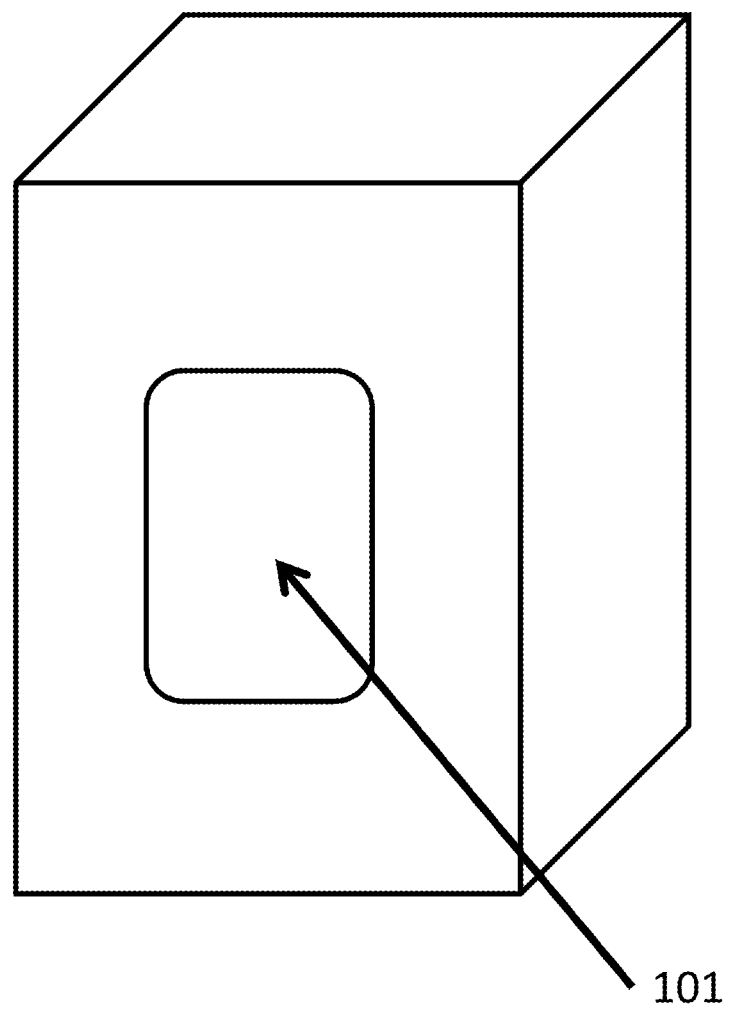
FIG. 1 illustrates a conventional device 100 which includes an object 101 having a surface which should desirably remain free of condensation and frost.

Referring now to the drawings, FIGS. 2A-10 illustrate some of the exemplary aspects of the present invention.

A problem with conventional devices and methods of inhibiting and/or removing condensation and frost on a surface, such as those described above, is that they often have a limited effectiveness. In particular, such conventional devices and methods often cannot reliably attain and maintain the clarity (e.g., transparency) of a surface, such as a surface of a door or window. In addition, such conventional devices and methods are often expensive, not scalable, and require significant energy and maintenance.

Thus, it is desirable to provide a device and method for inhibiting and/or removing condensation that have an improved effectiveness over conventional devices and methods.

Aspects of the present invention can inhibit and/or remove condensation and frost on a surface, such as a surface of a transparent member, by using an actuator such as a piezoelectric actuator or electrostrictive actuator film formed on the surface. Under an electric current, the actuator can move (e.g., constrict by pressure-based electric activation), to help inhibit or remove the condensation (e.g., fog or frost) from the surface. The term "electrostrictive" should be understood to mean having a property of changing shape under an application of an electric field (e.g., constricting by pressure-based electric activation).

The surface can include any surface which is desired to remain fog and frost-free. For example, the surface can include a surface of a transparent member such as a window or door. The surface can also include a surface of a mirror or other non-transparent member.

The aspects of the present invention provide a device and method of inhibiting (e.g., alleviating, removing, etc.) condensation that is more effective and efficient than conventional devices and methods. In particular, the aspects of the present invention can reliably attain and maintain the transparency (e.g., clarity) of a transparent member such as a window or door, in a manner that is affordable, scalable, low energy, low maintenance and free of outgas sing, discharges and contaminants.

An aspect of the present invention can include a treated surface on an electrostrictive actuator film to improve the effectiveness of an electrostrictive actuator film. In particular, the treated surface can include a plurality of channels which can inhibit and/or remove condensation and frost on the off of the electrostrictive actuator film.

Figure 2A:
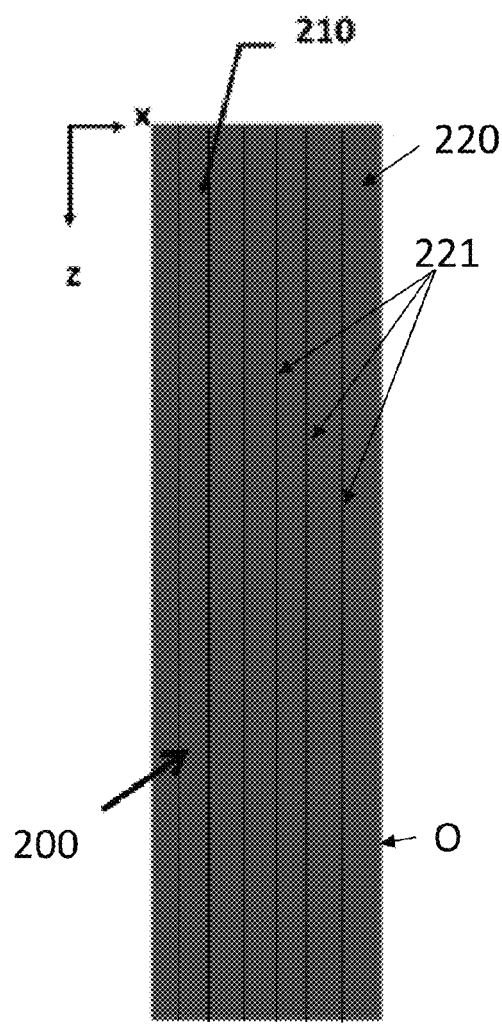
FIG. 2A illustrates a plan view of a condensation inhibiting layer 200 according to an exemplary aspect of the present invention.
Figure 2B:
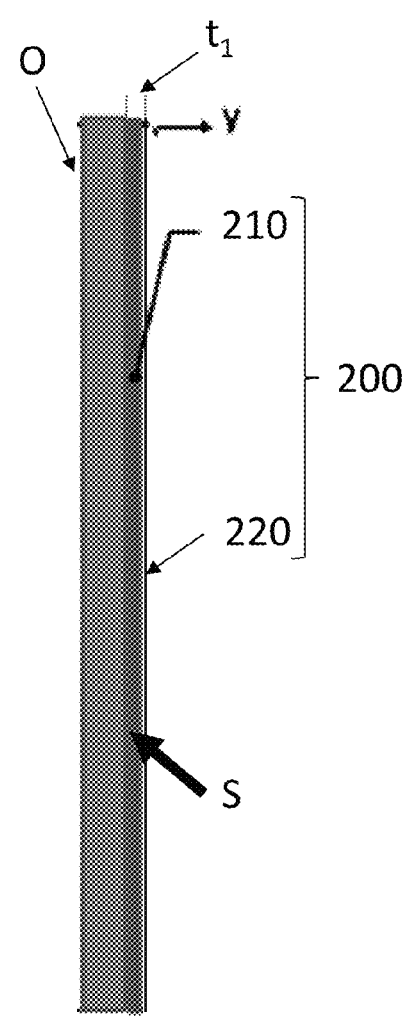
FIG. 2B illustrates a side view of a condensation inhibiting layer 200 according to an exemplary aspect of the present invention.

FIG. 2A illustrates a plan view of an object O (e.g., mirror, window, door, etc.) including a condensation inhibiting layer 200 according to an exemplary aspect of the present invention, and FIG. 2B illustrates a side view of the object O including the condensation inhibiting layer 200 according to an exemplary aspect of the present invention.

As illustrated in FIGS. 2A and 2B, the condensation inhibiting layer 200, includes an electrostrictive actuator film 210 formed on a surface S of the object O, and a treated surface 220 formed on the electrostrictive actuator film 210, and the treated surface 220 including a plurality of channels 221. The transparent electrostrictive actuator film 210 can have a thickness in a range from about 0.0004 mm to about 0.005 mm, and more preferably in a range from about 0.001 mm to about 0.005 mm.

The electrostrictive actuator film 210 can be transparent so that, for example, where the object O is a mirror, the layer 200 does not substantially affect the reflectivity of the mirror, and where the object O is a transparent door or window (e.g., a translucent door or window undersurface), the layer 200 does not substantially affect the transparency of the transparent door or window.

The condensation inhibiting layer 200 can have a hardness (e.g., rigidity) which is sufficient to make it durable, but be flexible enough to enable the layer 200 to be actuated by a voltage applied across the layer 200 (e.g., applied in the y-direction across the layer).

The treated surface 220 can include the same material as the electrostrictive actuator film 210. In particular, the treated surface 220 can include a surface of the electrostrictive actuator film 210. Alternatively, the treated surface 220 can include a material which is different from a material of the electrostrictive actuator film 210.

The treated surface 220 can also be transparent. For example, where the object O is a transparent window or door, the electrostrictive actuator film 210 and the treated surface 220 can be transparent so as not to substantially affect the transparency of the window or door.

As illustrated in FIGS. 2A and 2B, the plurality of channels 221 (e.g., vertical grooves) can extend from the top edge of the electrostrictive actuator film 210 to the bottom edge of the electrostrictive actuator film 210. The channels 221 can assist movement of water in the z-direction in FIG. 2A by providing a minimum gravitationally energetic path to reject water (e.g., water droplets) downward (e.g. as directed by gravity). A rejection drain can be formed at the bottom of the channels 221 to collect the condensate.

The plurality of channels 221 can include, for example, a micropatterned superhydrophobic surface which can reduce drag in liquid flow (e.g., provide laminar flow drag reduction). Superhydrophobic surfaces contain micro- or nanoscale hydrophobic features which can support a shear-free air-water interface between peaks in the surface topology. Particle image velocimetry and pressure drop measurements can be used to observe significant slip velocities, shear stress, and pressure drop reductions corresponding to drag reductions approaching 50%. At a given Reynolds number, drag reduction is found to increase with increasing feature size and spacing, as in laminar flows. The onset of drag reduction can occur at a critical Reynolds number where a viscous sublayer thickness approaches the scale of the superhydrophobic microfeatures and performance can increase with further reduction in viscous sublayer height.

Although the condensation inhibiting layer 200 is illustrated in FIGS. 2A and 2B as being formed on an entirety of the surface S of the object O, the layer 200 can be formed on only part of the surface S, depending upon the application. The amount of the surface S on which the layer 200 is formed depends upon the application. For example, where the object O includes a viewing portion and a non-viewing portion (i.e., a portion which is not necessarily required to remain transparent), the layer 200 can be formed on the surface S only for the viewing portion, and not formed on the surface S for the non-viewing portion.

Figure 2C:
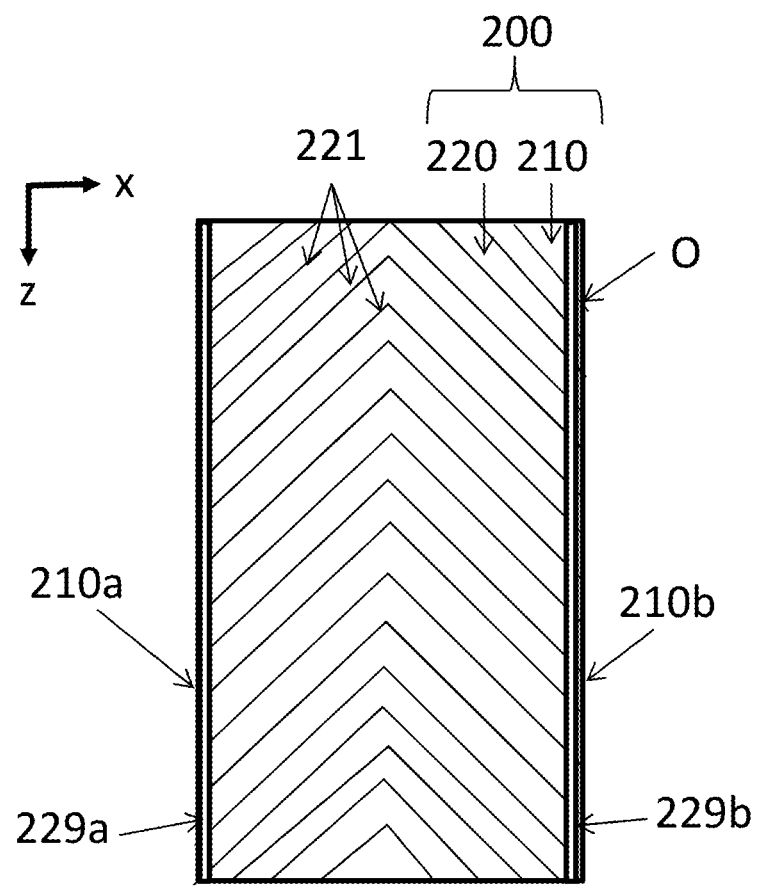
FIG. 2C illustrates a plan view of a treated surface 220 including a plurality of channels 221 according to another exemplary aspect of the present invention.

FIG. 2C illustrates a plan view of the treated surface 220 including a plurality of channels 221 according to another exemplary aspect of the present invention.

As illustrated in FIG. 2C, the plurality of channels 221 may not necessarily extend over the entire length in the z-direction of the electrostrictive actuator film 210, but can be angled to the side edges 210a, 210b of the electrostrictive actuator film 210. In this case, grooves 229a, 229b can be formed along the side edges 210a, 210b of the electrostrictive actuator film 210, so that water in the channels 221 can flow into the grooves 229a, 229b and downward (e.g., in the direction of gravity) and thereby removed from the object O.

Figure 2D:
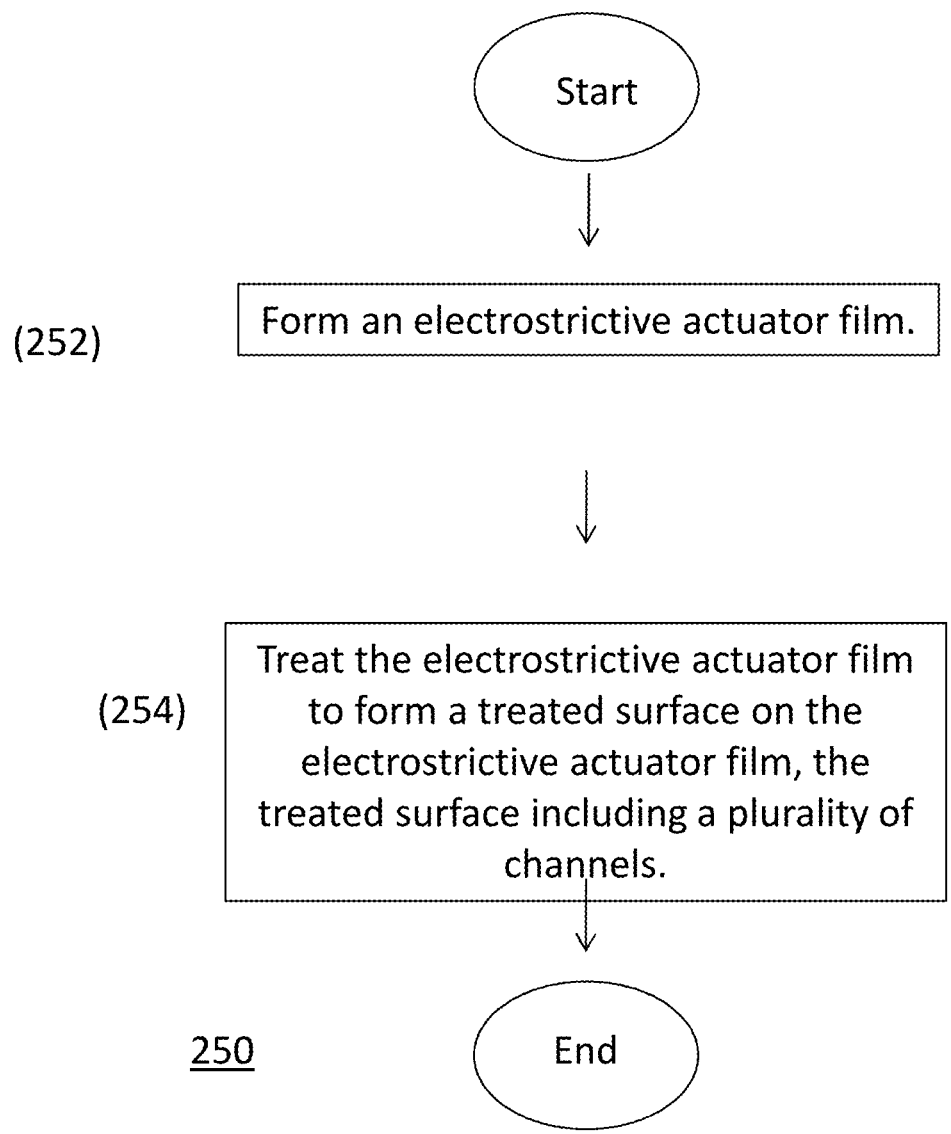
FIG. 2D illustrates a method 250 of forming the condensation inhibiting layer 200, according to an exemplary aspect of the present invention.

FIG. 2D illustrates a method 250 of forming the condensation inhibiting layer 200, according to an exemplary aspect of the present invention.

As illustrated in FIG. 2D, the method 250 can include forming (252) an electrostrictive actuator film 210, and treating (254) the electrostrictive actuator film 210 to form a treated surface 220 including a plurality of channels 221 on the electrostrictive actuator film 210. The forming (252) of the electrostrictive actuator film 210 can include liquid casting a piezoelectric material onto a substrate (e.g., a mirror, or transparent window or door), and subjecting the piezoelectric material to infra-red light (e.g., in a range of about 10 kW/m$^2$ to about 40 kW/m$^2$) to transform the piezoelectric material into the electrostrictive actuator film 210 (e.g., an impervious hydrophobic lamina bonded to the substrate). The treating (254) of the electrostrictive actuator film can include applying selected magnitude and direction laser emissions onto the electrostrictive actuator film 210 to form the treated surface 220 including the plurality of channels 221.

Figure 3A:
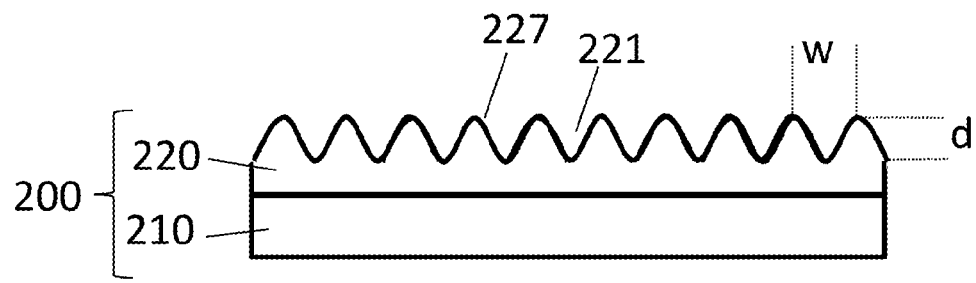
FIG. 3A illustrates a cross-sectional view of a treated surface 220 including a plurality of channels 221, according to an exemplary aspect of the present invention.
Figure 3B:
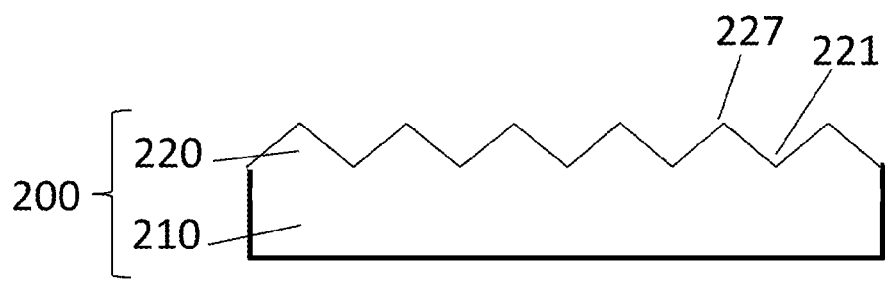
FIG. 3B illustrates a cross-sectional view of a treated surface 220 including a plurality of channels 221, according to another exemplary aspect of the present invention.
Figure 3C:
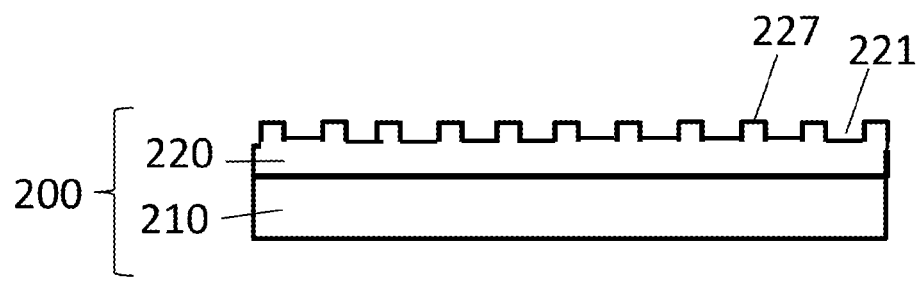
FIG. 3C illustrates a cross-sectional view of a treated surface 220 including a plurality of channels 221, according to yet another exemplary aspect of the present invention.

FIGS. 3A-3C illustrate a cross-sectional view of a treated surface 220 including a plurality of channels 221, according to an exemplary aspect of the present invention.

As illustrated in FIG. 3A, the treated surface 220 can include a plurality of ridges 227 formed by the material of treated surface 220. The plurality of ridges 227 (e.g., elevated portions) can be alternately formed with the plurality of channels 221 (e.g., recessed portions) and separate the plurality of channels 221.

A channel of the plurality of channels 221 can include a depth d in a range from about 0.005 mm to about 0.05 mm. The channel of the plurality of channels 221 can also have a width w in a range from about 0.05 mm to about 10 mm. The plurality of channels 221 can also have a uniform depth and width, or the depth and width can vary over the plurality of channels 221.

The treated surface 220 can be formed as a separate layer from the electrostrictive actuator film 210 as illustrated in FIG. 3A, or can be the same layer as the electrostrictive actuator film 210 as illustrated in FIG. 3B. That is, a surface of the electrostrictive actuator film 210 can be treated (e.g., patterned by etching, machining, etc.) to form the plurality of channels 221 in the treated surface 220.

As illustrated in FIG. 3A, the channels 221 and ridges 227 can define a sinusoidal wave cross-section (e.g., alternating convexo-concave shape) in the treated surface 220. Alternately, the channels 221 and ridges 227 can define a triangular wave cross-section in the treated surface 220 as illustrated in FIG. 3B, or can define a square wave cross-section in the treated surface 220 as illustrated in FIG. 3C.

It should be noted FIGS. 3A-3C are illustrative. That is, the shape of the treated surface 220 is not limited to the shapes illustrated in FIGS. 3A-3C.

The treated surface 220 in FIGS. 2A-2C and 3A-3C can be formed by etching (e.g., chemically etching, laser etching, etc.) a material of the electrostrictive actuator film 210 or by mechanically treating the material of the electrostrictive actuator film 210. For example, where the electrostrictive actuator film 210 is formed of a supersmooth, super tough, superhydrophobic silica polymer, the treated surface 220 can be formed by laser etching a surface of the silica polymer in a laser etching process which is applied to the electrostrictive actuator film 210.

For example, the laser etching can apply selected magnitude and direction laser emissions to the film 210 to generate translucent vertical channels on a surface of the film 210, the channels being invisible to the human eye within the film 210, therein facilitating vertical (and thus minimum length) liquid transport of unwanted condensate downward to a rejection drain which collects the condensate.

That is, the etching can maximize gravitational advection of droplets downward to a rejection drain. In particular, the etching can cause channels 221 to form on surface of the film 210 (e.g., the treated surface 220) and the channels 221 can maximize gravitational advection of moisture droplets downward to a rejection drain.

The Electrostrictive Actuator Film (e.g., Transparent Electrostrictive Actuator Film)

The film 210 can be formed on a surface (e.g., a surface of a mirror, or transparent window or door) by liquid casting a liquid composition of the film 210 onto the surface. For example, the liquid composition can be deposited onto the surface or sprayed onto the surface. The liquid composition of the film 210 can then be treated in order to cure the liquid composition and form the film 210, and cause film 210 to adhere to the surface.

For example, the liquid composition of the film 210 can be such that when it is subjected to infra-red light (e.g., in a range of about 10 kW/m$^2$ to about 40 kW/m$^2$), the liquid composition reacts to form an impervious hydrophobic lamina. In particular, the liquid composition of the film 210 can be treated by an infra-red induced reaction to cure the film 210 and amalgamate the film 210 durably to the surface, so that the film 210 retains a hydrophobic yet translucent quality while being tolerant of abrasion, cleaning chemical exposure and the like.

Alternatively to liquid casting the liquid composition of the film 210 onto the surface, the film 210 can be previously formed and then later applied to the surface in a "peel and stick" process. That is, a composition of the film 210 can be liquid cast onto a substrate, treated (e.g., cured) and removed from the substrate to form a sheet of the film 210. An adhesive can then be applied to the sheet of the film 210 (or to the surface), and the sheet of the film 210 applied to the surface, with the adhesive side down, so that the adhesive causes the sheet of the film 210 to adhere to the surface. If necessary, the sheet of the film 210 can be cut to fit the surface either prior to or subsequent to the application of the sheet of the film to the surface.

The electrostrictive actuator film 210 can include, for example, a supersmooth, super tough, superhydrophobic silica polymer, so that when the electrostrictive actuator film 210 is affixed to an object such as a glass or an equivalent translucent substrate, the film 210 can minimize a contact angle of liquid water droplet formations upon the object.

The electrostrictive actuator film 210 can include, for example, an electrostrictive polymer film, a large-area graphene (LAG) film, or some combination of an electrostrictive polymer film and an LAG film. The electrostrictive actuator film 210 can also be formed of one layer (e.g., one material), or a plurality of layers (e.g., a plurality of different materials).

The transparent electrostrictive actuator film 210 can include, for example, a silicone film made of Dow Corning Sylgard® Silicones (e.g., Sylgard 182® or Sylgard 184®). These silicones are highly viscous fluids which have a viscosity of 3.9 kg/ms. Sylgards are supplied in two parts: the base and the curing agent. The general ratio of cross linker, in the form of tetraethyl orthosilicate, or fluorinated silane, (1H, 1H, 2H, 2H, perfluorooctyl triethoxysilane-Sigma Aldrich or similar), in a ratio of 20:1 or less of the base polydimethyl siloxane (PDMS) polymer to curing agent using a condensation tin catalyst, either dibutyl tin diacetate or dibutyl tin diacetate, at a concentration of 1% or less. The mixture can be degassed prior to application to remove gas bubbles entrained during the mixing process.

Thus, where the electrostrictive actuator film 210 includes a silicone film, the film 210 can be formed by mixing the base and curing agent respectively in a ratio of about 10:1. After mixing, the silicone is left for about 30 minutes to start the curing process, and to allow air bubbles introduced during the mixing to escape. The mixed silicone polymer can then be spread or sprayed onto a surface (e.g., a surface of a mirror, or transparent window or door) to form a substantially uniform thin film (e.g., less than 100 μm) on the surface. The thin film is then cured for at least about 24 hours at a temperature in a range from about 100° C. to about 150° C.

The electrostrictive actuator film 210 can also include (e.g., in addition to or in place of the silicone film) a silica sol which is superhydrophobic, transparent, adherent, thermally stable, and highly durable against humidity. The silica sol can be formed using vinyltrimethoxysilane (VTMS) as a hydrophobic reagent in a single step sol-gel process, or fluorinated silane, (1H, 1H, 2H, 2H, perfluorooctyl triethoxysilane-FTEOS) as the hydrophobizing agent. In particular, silica sol can be prepared by incorporating VTMS or FTEOS into a silica film such as a tetraethyl orthosilicate (MOS) based silica film, in order to make the silica film superhydrophobic (e.g., static water contact angle ≥140°. Hydrophobic fillers that are transparent, such as methylated silica, spinel ($Mg_2AlO_4$), and yttria ($Y_2O_3$), or alumina, $Al_2O_3$, sapphire can also be used as a hydrophobizing agent in the silica sol.

The electrostrictive actuator film 210 can also include (e.g., in addition to or in place of the silicone film) an asymmetrically surface-modified graphene film. In particular, hexane and oxygen ($O_2$) plasma treatment can be applied to opposite sides of a graphene film to induce asymmetrical surface properties and hence asymmetrical electrochemical responses, responsible for actuation.

The graphene film can be formed, for example, by direct filtration of an aqueous suspension of reduced graphene oxide colloids. The thickness of the graphene film can be in a range from about 4 μm to about 5 μm, in order to provide a free-standing, mechanically flexible but not stiff graphene film.

The hexane plasma treatment enhances the surface hydrophobicity and effectively protects the surface of the graphene film from the accessibility of electrolyte ions, which accordingly weakens the electrochemical response of the surface. The oxygen plasma treated surface can become very hydrophilic and readily accessible to aqueous media due to the plasma-induced oxygen-containing groups.

The asymmetric surface properties of graphene film can induce the distinction of electrochemical response, which produces the driving force responsible for the actuation behavior.

The Condensation Inhibiting Device

Figure 4A:
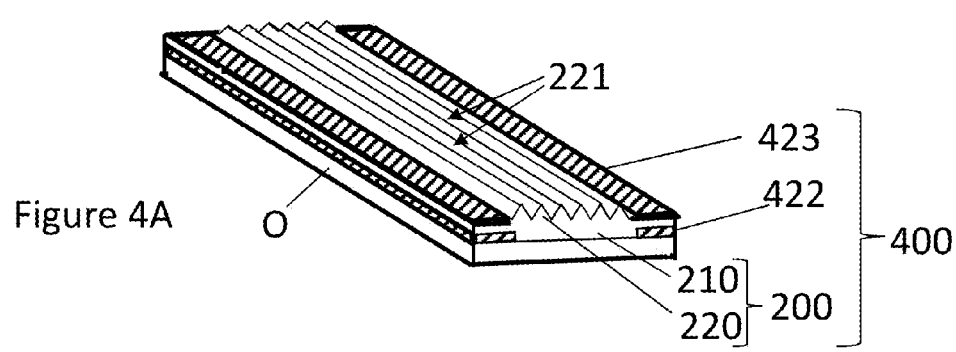
FIG. 4A illustrates a perspective view of a condensation inhibiting device 400, according to an exemplary aspect of the present invention.
Figure 4B:
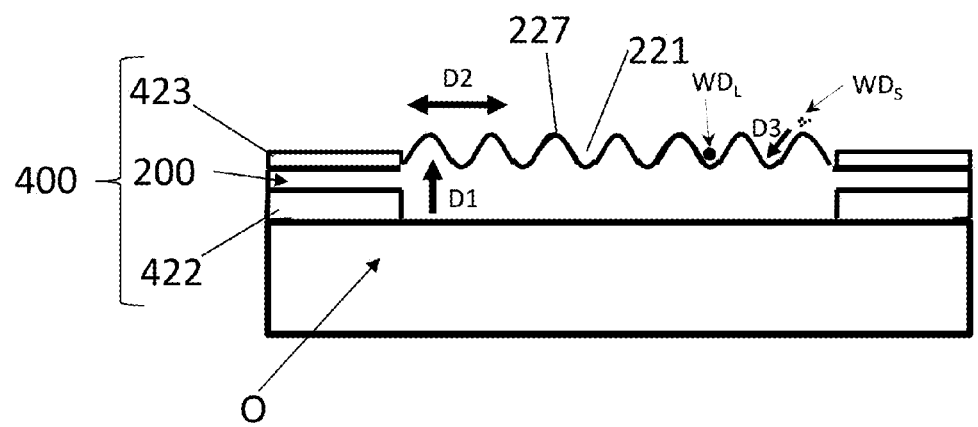
FIG. 4B illustrates a cross-sectional view of the condensation inhibiting device 400, according to an exemplary aspect of the present invention.

Referring again to the drawings, FIGS. 4A-4B illustrate a condensation inhibiting device 400, according to an exemplary aspect of the present invention.

As illustrated in FIG. 4A, the condensation inhibiting device 400 includes an electrode 422 that can be formed on a surface of the object O (e.g., a surface such as a mirror, or a transparent window or door). The condensation inhibiting device 400 also includes a condensation inhibiting layer 200 (e.g., a transparent condensation inhibiting layer) which is formed on the electrode 422 such that the electrode 422 is electrically connected to the condensation inhibiting layer 200. As described above, the condensation inhibiting layer 200 can include an electrostrictive actuator film 210 (e.g., a transparent electrostrictive actuator film) and a treated surface 220 formed on the electrostrictive actuator film 210 and including a plurality of channels 221. The condensation inhibiting device 400 can also include an electrode 423 (e.g., ground electrode) formed on the condensation inhibiting layer 200 such that the condensation inhibiting layer 200 is formed between the electrode 422 and the electrode 423.

The condensation inhibiting device 400 can include one or more set of electrodes 422 and 423 which are formed on only one edge (e.g., side) of the object O. In particular, as illustrated in FIG. 4A, the condensation inhibiting device 400 can include two sets of electrodes 422 and 423 which are formed on opposing edges (e.g., sides) of the object O. However, this is only illustrative and not limiting.

In addition, although FIG. 4A illustrates the two sets of electrodes 422, 423 being formed in a longitudinal direction which is the same as a running direction of the plurality of channels 221, this is also illustrative. That is, a set of electrodes 422, 423 can be formed in a direction perpendicular to the running direction of the plurality of channels 221 (e.g., formed on an edge of the object O at an end of the plurality of channels 221).

The electrode 422 can be connected to a voltage source (e.g., current source) which applies an electrical potential across the condensation inhibiting layer 200. As illustrated in FIG. 4B, the electrical potential may be applied to the condensation inhibiting layer 200 in a direction D1 (i.e., from the electrode 422 to the electrode 423).

The voltage source can apply a voltage to the condensation inhibiting layer 200 to produce a contractive, piezoelectric constrictive response in the condensation inhibiting layer 200. The contractive, piezoelectric constrictive response in the condensation inhibiting layer 200 can inhibit a formation of condensation or frost on the electrostrictive actuator film, and/or remove water or frost from the condensation inhibiting layer 200. Thus, for example, where the object O is a transparent window or door, the piezoelectric constrictive response can maintain a transparency of the transparent window or door.

In particular, the voltage from the voltage source can be a pulsed voltage which is applied by the electrode 422 to the condensation inhibiting layer 200. The pulsed voltage can cause the condensation inhibiting layer 200 to be rapidly and repeatedly constricted and relaxed, which causes the ridges 227 to vibrate in a direction D2 as illustrated in FIG. 4B. That is, the amplitude of the voltage pulse, the period of the voltage pulse, and the period between voltage pulses can be selected so as to cause the ridges 227 to vibrate. The vibration in the ridges 227 caused by the pulsed voltage can generate a sufficient force to shake small water droplets WDs off of the ridges 227 (e.g., in the y direction as illustrated in FIG. 2B) and/or can cause the small water droplets WDs to migrate in the direction D3 into the plurality of channels 221.

The small water droplets WDs combine in the plurality of channels 221 to form large water droplets $WD_L$, which can be more easily forced downward (e.g., in the z direction in FIG. 2A) by gravity and by the vibration of the ridges 227, than the small water droplets WDs. The large water droplets $WD_L$ can then be collected at an end of the plurality of channels 221 in a reservoir.

In a particular embodiment, an amplitude of the voltage pulse can be up to about 5000V DC for a high voltage operation. If certain design criteria for stepping voltages make high voltage too cumbersome, then a low voltage can be specified but it would take longer for actuation. Further, a pulse period of the voltage pulse (i.e., the length of time of the voltage pulse) can be in a range from about 0.001 seconds to about 0.01 seconds, and a frequency of the voltage pulse (e.g., the length of time between voltage pulses) can be, for example, in a range from about 1 hour to about 4 hours.

Figure 5A:
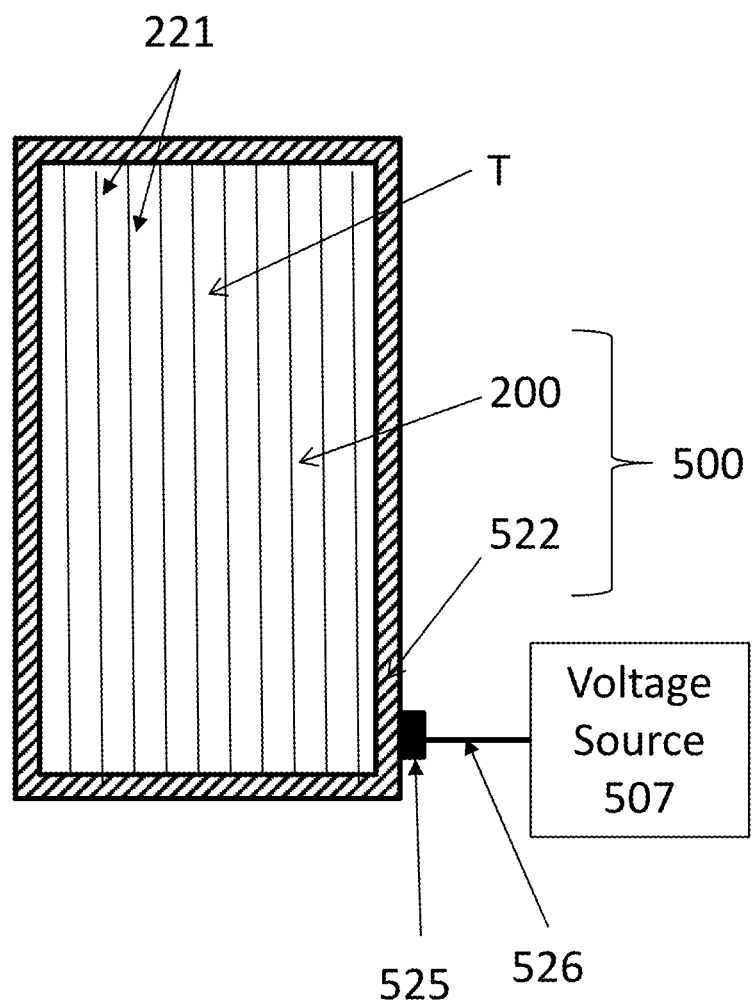
FIG. 5A illustrates a plan view of condensation inhibiting device 500, according to an exemplary aspect of the present invention.
Figure 5B:
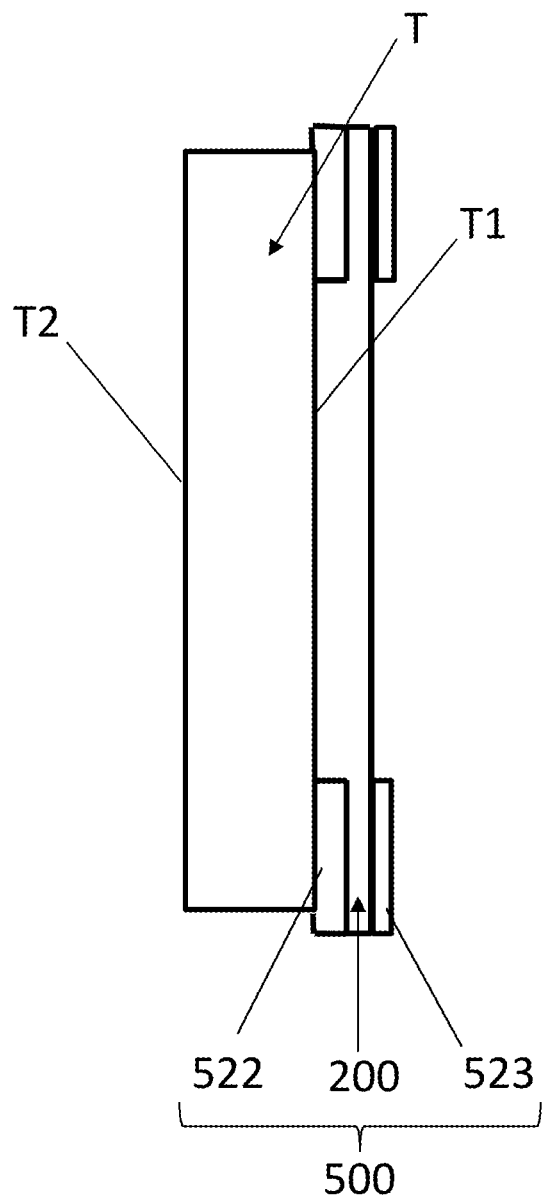
FIG. 5B illustrates a cross-sectional view of a condensation inhibiting device 500, according to an exemplary aspect of the present invention.
Figure 5C:
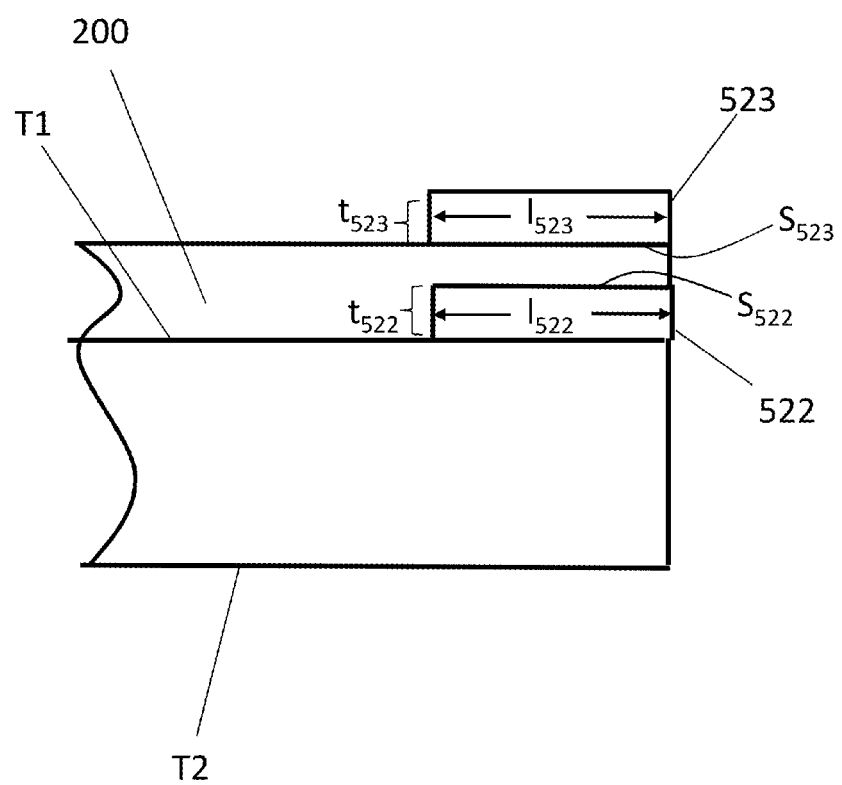
FIG. 5C illustrates an arrangement of electrode 522, according to another exemplary aspect of the present invention.

FIGS. 5A-5C illustrate a condensation inhibiting device 500, according to an exemplary aspect of the present invention.

As illustrated in FIG. 5A, the condensation inhibiting device 500 includes a condensation inhibiting layer 200 and an electrode 522 electrically connected to the condensation inhibiting layer 200. As described above, the condensation inhibiting layer 200 can include an electrostrictive actuator film 210 (e.g., a transparent electrostrictive actuator film) which is formed on a transparent member T, and a treated surface 220 formed on the electrostrictive actuator film 210 and including a plurality of channels 221.

The electrode 522 can include a connector 525 for connecting via an electrically conductive line 526 to voltage source 507, the voltage source 507 applying a voltage (e.g., a pulsed voltage) to the electrode 522 via the conductive line 526. The voltage source 507 can include, for example, a standard AC (e.g., 110V) power supply which can be converted (e.g., by a power adapter) to a DC voltage before being applied across the condensation inhibiting layer 200. Alternatively, the voltage source 507 can include a DC power supply such as a battery.

As illustrated in FIG. 5A, the electrode 522 can be formed around a periphery of the transparent member T (e.g., the electrode 522 can be integrated with a face of the transparent member T). Alternatively, the electrode 522 can be formed around a portion of the periphery of the transparent member T. That is, the electrode 522 can be formed on only one edge, two edges or three edges of the transparent member T.

FIG. 5B is a cross-sectional view of the transparent member T in FIG. 5A, according to an exemplary aspect of the present invention.

As illustrated in FIG. 5B, the condensation inhibiting layer 200 can be formed on the surface T1 of the transparent member T (e.g., opposite surface T2 of the transparent member T) and on the electrode 522. The condensation inhibiting device 500 can also include another electrode 523 which is formed on condensation inhibiting layer 200 so that a portion of the condensation inhibiting layer 200 which is around the periphery of the transparent member T is sandwiched between the electrodes 522, 523. The another electrode 523 can have a shape similar to the electrode 522 and can be formed of the same (or different) material as the electrode 522. The another electrode 523 can be connected, for example, to a ground potential. For simplicity, the another electrode 523 may not be illustrated in other drawings.

A voltage generated by the voltage source 507 can be applied across the condensation inhibiting layer 200 by the electrodes 522, 523. For example, referring to FIG. 2B, the voltage can be applied in the Y direction across the condensation inhibiting layer 200.

The electrodes 522, 523 can include a thin layer of conductive material such as copper, a copper alloy, or graphene. In order to enable the condensation inhibiting layer 200 to expand and contract freely, the electrodes 522, 523 should not add any stiffness to the condensation inhibiting layer 200. That is, the electrodes 522, 523 should be compliant with the condensation inhibiting layer 200. For example, in an exemplary aspect, the electrodes 522, 523 are at least as compliant as the condensation inhibiting layer 200.

To ensure that the electrodes 522, 523 are compliant with the condensation inhibiting layer 200, the electrodes 522, 523 should be formed of a pliable material (e.g., copper, a copper alloy, or graphene), and have a thickness which small enough to ensure that the electrodes 522, 523 are compliant with the condensation inhibiting layer 200. In an exemplary aspect, the electrodes 522, 523 can have a thickness which is less than a thickness of the condensation inhibiting layer 200.

Because the strain produced by the condensation inhibiting layer 200 generally decreases with an increase in thickness, the thickness of the condensation inhibiting layer 200 should be no greater than about 500 µm. Further, because the strain produced generally decreases with an increase in thickness of the electrodes 522, 523, the thickness of each of the electrodes 522, 523 should be no greater than about 10 µm.

However, because the electrode 522 is also producing the electric current to drive the condensation inhibiting layer 200, the electrode 522 should have a sufficient thickness to produce an electric field of sufficient magnitude for creating a minimum amount of strain in the film (e.g., an amount of strain which is sufficient to provide an anti-fog and/or anti-frost movement to the condensation inhibiting layer 200).

In one particular embodiment, the electrode 522 can produce an electric field of at least about 50 mV/m and the condensation inhibiting layer 200 (e.g., in FIGS. 2A-2C, 3A-3C and 5A-5B) can have a strain of at least about 20%.

The electrode 522 can be formed of one or more layers, and can include one or more materials. The material of the electrode 522 can include, for example, polysilicon, indium tin oxide (ITO), copper and its alloys, aluminum and its alloys, gold and graphene (large area graphene (LAG)).

In another particular embodiment, the electrode 522 can include a transparent electrode such as a layer of ITO, a layer of LAG or a plurality of layers of LAG, or some combination of layers of ITO, LAG and other transparent thermoelectric materials.

For example, the electrode 522 can include a layer of LAG having a thickness in a range from about 1 nm to about 10 nm. For example, in some embodiments, LAG is preferred over a gold (Au) electrode, because a gold electrode cracks at about a 6% strain whereas a LAG electrode should be capable of at least about 25% strain. In particular, the layer of LAG can have a small thickness (e.g., having a thickness less than about 10 nm) so that the layer of LAG will be transparent. Thus, the electrode 522 including the thin layer of LAG can be formed over more of the surface T1 of the transparent member T (e.g., over an entirety of the surface T1).

FIG. 5C illustrates the electrode 522, according to another exemplary aspect of the present invention.

As illustrated in FIG. 5C, the electrode 522 can be formed on a surface T1 of the transparent member T (e.g., opposite surface T2 of the transparent member T). Although in FIG. 5C, the electrode 522 is illustrated as physically contacting the surface T1 of the transparent member T, the electrode 522 can be disposed separate from (e.g., spaced apart from) the surface T1 of the transparent member T.

The thickness ($t_{522}$) of the electrode 522 can be in a range from about 0.1 mm to about 1 mm. The thickness of the electrode 523 ($t_{523}$) can also be in a range from about 0.1 mm to about 1 mm. The thicknesses ($t_{522}$) and ($t_{523}$) can be the same, or can be different depending upon the application. The thickness of the electrodes 522, 523 can be uniform or can vary depending upon the application.

The length ($l_{522}$) of electrode 522 can be in a range from about 0.1 mm to about 1 mm. The length ($l_{523}$) of electrode 523 can be in a range from about 0.1 mm to about 1 mm. The lengths ($l_{522}$) and ($l_{523}$) can be the same, or can be different depending upon the application. For example, the length ($l_{522}$) of electrode 522 can be greater than or less than the length ($l_{523}$) of the electrode 523.

In particular, as noted above, where the electrode 522 is formed of a transparent material such as LAG or ITO, the electrode 522 can be formed of the LAG or ITO which is formed over the entire surface T1.

In addition, a surface $S_{522}$ of the electrode 522 can be treated (e.g., chemically or mechanically etched or roughened) in order to increase an area of the surface $S_{522}$ and, thereby increase an amount of interface between the electrode 522 and the condensation inhibiting layer 200. This can improve an ability of the electrode 522 to apply a voltage (e.g., electrical potential) to the condensation inhibiting layer 200, and can also improve adhesion between the electrode 522 and the condensation inhibiting layer 200. Similarly, a surface $S_{523}$ of the electrode 523 can be treated (e.g., chemically or mechanically etched or roughened) in order to increase an area of the surface $S_{523}$.

As illustrated in FIG. 5C, the condensation inhibiting layer 200 can be formed on the electrode 522, so that the electrode 522 is formed between the transparent member T and the condensation inhibiting layer 200. The condensation inhibiting layer 200 can physically contact an entire length of the electrode 522, or may contact only a portion of the electrode 522. However, the amount of contact (e.g., the area of interface) between the electrode 522 and the condensation inhibiting layer 200 should be sufficient to actuate the condensation inhibiting layer 200 (e.g., sufficient to cause the condensation inhibiting layer 200 to constrict) so as to inhibit condensation on the surface T1.

FIGS. 5D-5G illustrate other arrangements of the electrodes 522 and 523, according to an exemplary aspect of the present invention.

Figure 5D:
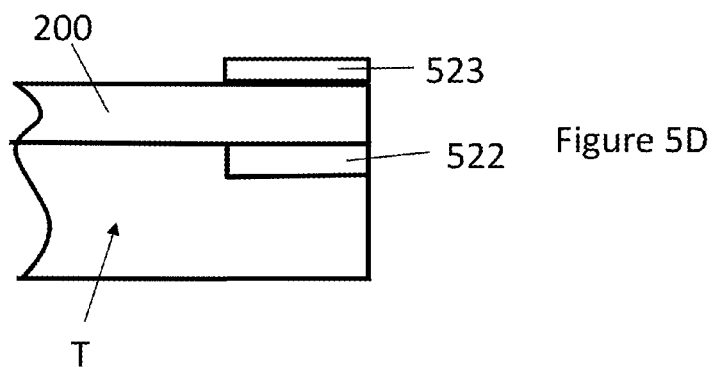
FIG. 5D illustrates another arrangement of the electrode 522, according to an exemplary aspect of the present invention.

As illustrated in FIG. 5D, the transparent member T can have a shape (e.g., machined to have a shape) so that a surface of the electrode 522 is formed to be flush with the surface T1.

Figure 5E:
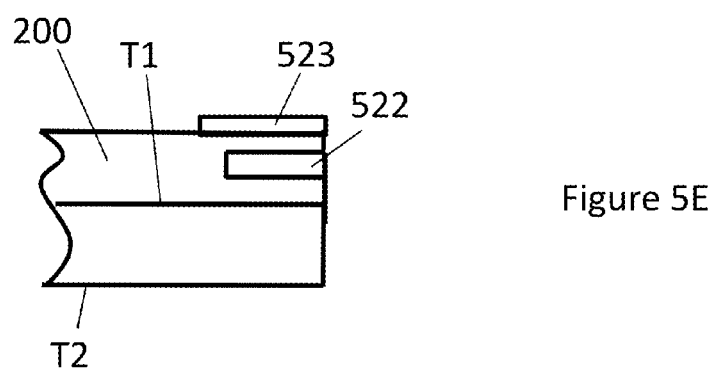
FIG. 5E illustrates another arrangement of the electrode 522, according to an exemplary aspect of the present invention.

As illustrated in FIG. 5E, the electrode 522 can be formed within the condensation inhibiting layer 200, which can increase an amount of contact (e.g., greater area of interface) between the electrode 522 and the condensation inhibiting layer 200.

Figure 5F:
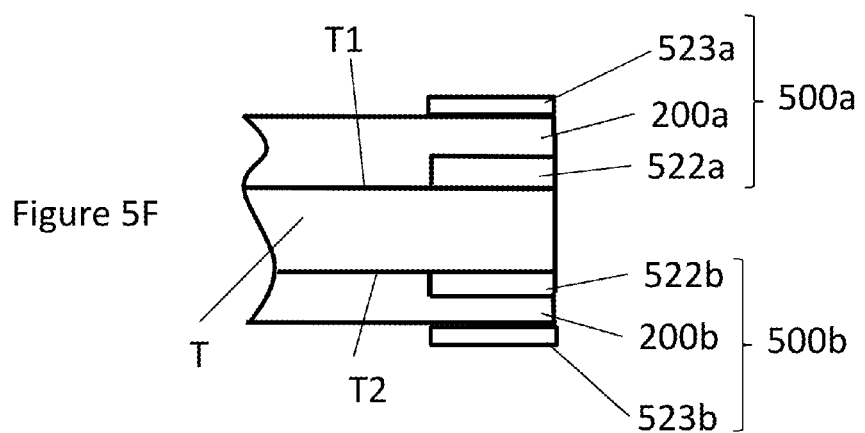
FIG. 5F illustrates another arrangement of the electrode 522, according to an exemplary aspect of the present invention.

As illustrated in FIG. 5F, a first condensation inhibiting device 500a including condensation inhibiting layer 200a, electrode 522a and electrode 523a, can be formed on surface T1 of the transparent member T, and a second condensation inhibiting device 500b including condensation inhibiting layer 200b, electrode 522b and electrode 523b, can be formed on surface T2.

Figure 5G:
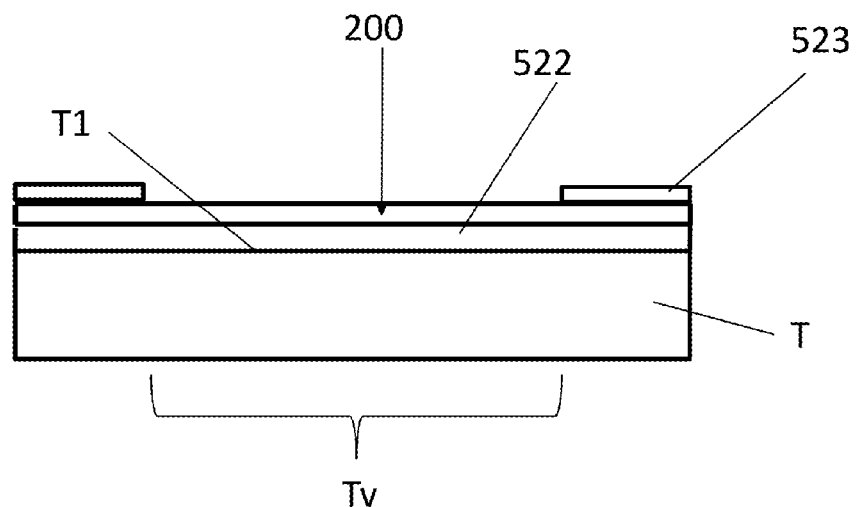
FIG. 5G illustrates an arrangement of electrode 522 which is formed of a transparent material, according to an exemplary aspect of the present invention.

As illustrated in FIG. 5G, the electrode 522 can include a transparent material such as ITO or LAG, in which case the electrode 522 can be formed substantially over an entirety of the surface T1. In particular, the electrode 522 can be formed on a viewing portion Tv of the transparent member T (e.g., a portion of the transparent member T which should remain transparent).

Figure 6:
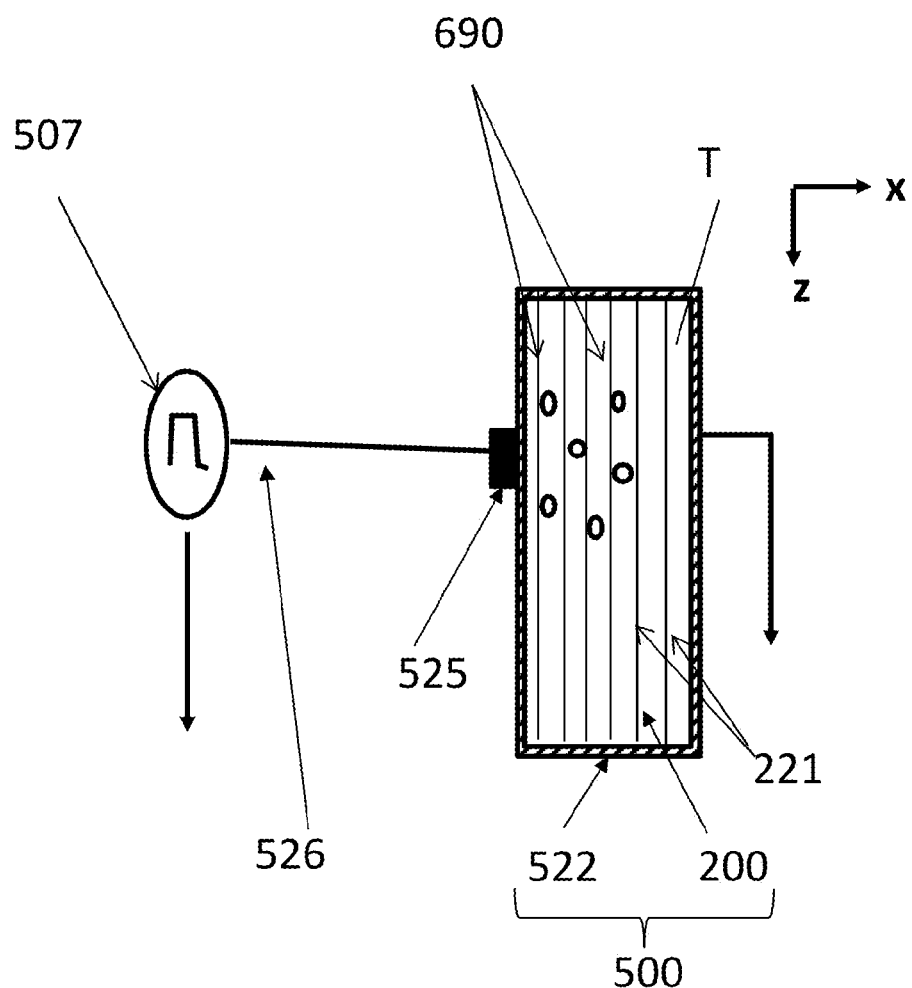
FIG. 6 illustrates an operating mechanism of the condensation inhibiting device 500, according to an exemplary aspect of the present invention.

FIG. 6 illustrates an operating mechanism of the condensation inhibiting device 500, according to an exemplary aspect of the present invention.

As illustrated in FIG. 6, a voltage source 507 can generate a voltage that is used to perform piezo-induced atomization of condensation. The voltage source 507 (e.g., pulsed voltage source) can generate a voltage (e.g., pulsed voltage) that is transmitted via an electrically conductive line 526 to the connector 525 on the electrode 522.

The layer 200 can include a piezoelectric material such as a silica polymer (e.g., an electroactive polymer), which can piezoelectrically constrict in response to input of voltage from the voltage source 507. The constriction of the layer 200 can atomize any remaining moisture (e.g., droplets of moisture) vertically off of the layer 200. For example, the moisture droplets 690 can be repulsed by the layer 200 in the y direction (e.g., up in a direction away from the layer 200) which is illustrated in FIG. 2B.

That is, the layer 200 (e.g., lamina) can be connected to the electrode 522 (e.g., surrounding electrical conductor), and the electrode 522 can be capable of applying an electrical potential relative to the surrounding matter which produces a contractive, piezoelectric constrictive response in the layer 200 as an arbitrary function of frequency.

The properties of the condensation inhibiting device 500 can be selected by the designer to ensure that the transparent member T remains fog-free and frost-free, and ensure that the transparent member T remains transparent. Factors to consider in the design can include, for example, the area of the transparent member T, the thickness of the transparent member T, the material (e.g., thermal conductivity) of the transparent member T, and the ambient conditions (e.g., temperature, humidity, etc.) on the surfaces T1 and T2 (e.g., see FIG. 5B) of the transparent member T.

For example, if the contact area between the electrode 522 and the layer 200 is too small, or if the amount of voltage generated by the voltage source 507 is too small, then the amount of movement in the layer 200 (e.g., vibration of the layer 200) will be too small to inhibit condensation. The result can be that only the portion of the layer 200 nearest the electrode 522 will remain transparent, and a central portion of the transparent member T will not remain transparent (e.g., is not made fog-free and frost-free).

On the other hand, if the contact area between the electrode 522 and the layer 200 is too great, or if the amount of voltage generated by the voltage source 507 is too great, then the device 200 may be wasting energy and may result in a decreased life of the layer 200, since the life of the layer 200 may depend upon the number of times a voltage is applied to the layer 200 and the amount of the voltage (e.g., amplitude of the voltage pulse) applied to the layer 200.

The various properties of the condensation inhibiting device 500 can be selected based on the particular application. For example, a transparent member T having a large area can require the layer 200 to be formed of a material "X" and have a thickness $t_{f1}$, the electrode 522 to have a first thickness $t_{e1}$ with a contact area $A_1$ between the electrode 522 and the layer 200. Whereas, a second transparent member T having a small area may require the layer 200 to be formed of a material "Y" and have a thickness $t_{f2} < t_{f1}$, and the electrode 522 to have a thickness $t_{e2} < t_{e1}$ with a smaller contact area $A_2 < A_1$ between the electrode 522 and the layer 200.

Figure 7:
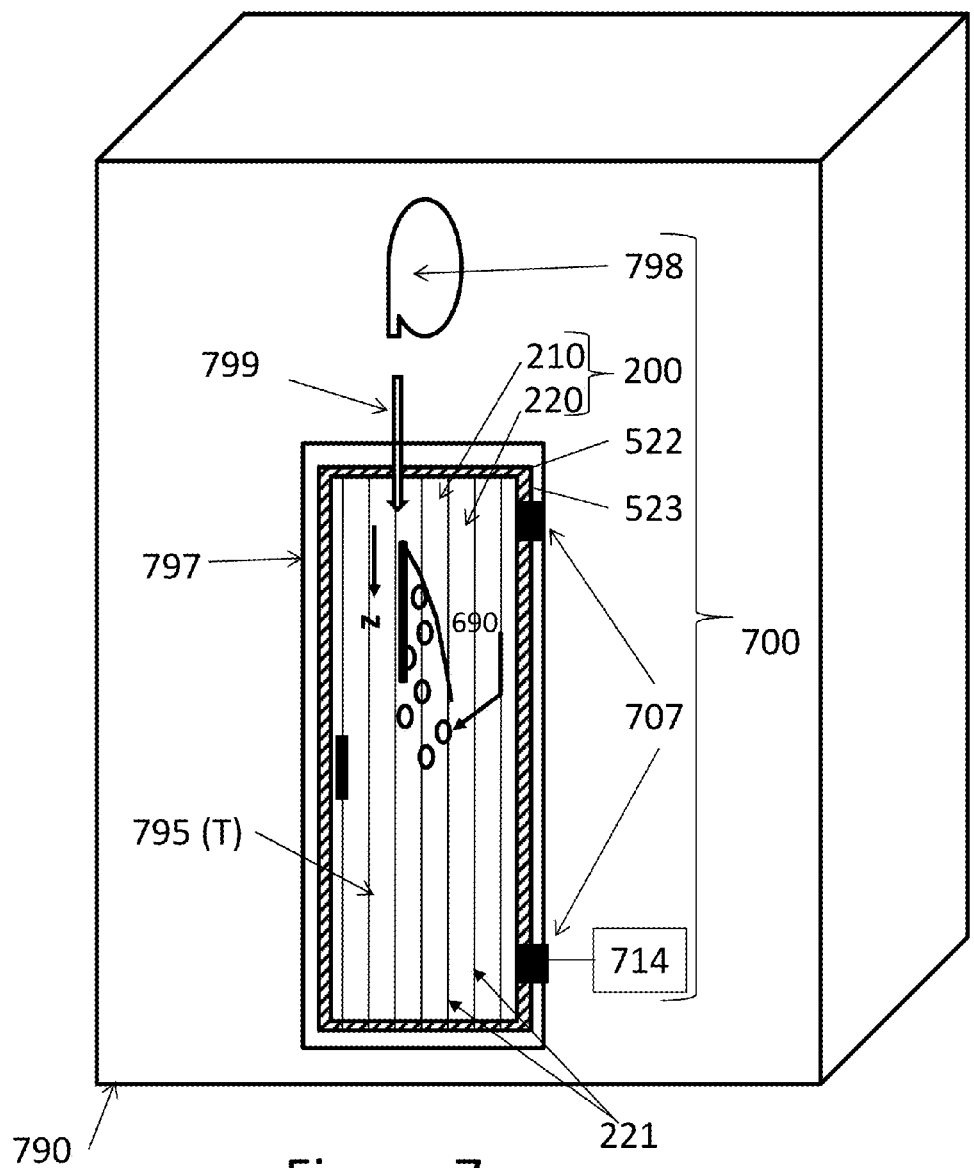
FIG. 7 illustrates a condensation inhibiting device 700, according to another exemplary aspect of the present invention.

FIG. 7 illustrates a condensation inhibiting device 700, according to another exemplary aspect of the present invention. As illustrated in FIG. 7, the condensation inhibiting device 700 can be formed as part of a device 790 such as a refrigerator or freezer. The device 790 can include a transparent door 795 and the condensation inhibiting device 700 can operate to inhibit and/or remove condensation and frost from the transparent door 795 to maintain a transparency of the transparent door 795.

The condensation inhibiting device 700 includes a condensation inhibiting layer 200 formed on the door 795. The condensation inhibiting layer 200 (e.g., formed on the door 795) can include an electrostrictive actuator film 210 (e.g., a transparent layer including a silica polymer having a piezoelectric property), and a treated surface 220 (e.g., plurality of channels or surface irregularities) formed on the transparent electrostrictive actuator film 210. The treated surface 220 includes a plurality of channels 221.

The condensation inhibiting device 700 also includes an electrode 522 formed on the condensation inhibiting layer 200 (e.g., formed around a periphery of the condensation inhibiting layer 200 and around a periphery of the door 795) and a voltage source 707 electrically connected to the electrode 522. The voltage source 707 applies a voltage to the layer 200 to move (e.g., constrict) the layer 200, thereby inhibiting condensation and frost on the door 795 by forming atomized moisture droplets 690 that are more amenable, for example, to convective removal inside the device 790.

As illustrated in FIG. 7, the condensation inhibiting device 700 can include (as voltage source) a spring-loaded hinge 707 (e.g., a plurality of spring loaded hinges) which connects the door 795 to a door frame 797 of the device 790. The spring-loaded hinge 707 can generate energy in the closing of the door 795, and that energy can be applied by the electrode 522 to the layer 200, thereby actuating a sudden piezoelectrically-induced wave that transports any remaining condensate droplets vertically upward into the device 790 (e.g., into the refrigerator), thus rendering a view through the door 795 of the device 790 unobstructed by unwanted condensate and frost.

The condensation inhibiting device 700 can also include a control circuit 714 which can collect the energy generated by the spring-loaded hinge 707 in the closing of the door 795, and once the door is closed, the circuit 714 can controllably release the collected energy into the electrode 522. In particular, the circuit 714 can release the collected energy into the electrode 522 in pulses.

As illustrated in FIG. 7, the condensation inhibiting device 700 can also include an air current source 798 which will selectively generate an air current 799. For example, where the device 790 is a refrigerator, the air current source 798 can include the fan of the refrigerator's cooling system, and the air current 799 can include the in-cabinet convection generated by the fan.

When the moisture droplets 690 depart the condensation inhibiting layer 200 due to the piezoelectric constriction of the condensation inhibiting layer 200, the moisture droplets 690 can be transported away from the treated surface 220 by the air current 799 in the device 790. The air current source 798 can be controlled by the control circuit 714, to generate the air current 799 periodically, or after the door 795 is closed.

Thus, the condensation inhibiting device 700 can inhibit condensation by one or more (e.g., a combination of two or three) actions. First, the condensation inhibiting layer 200 can be hydrophobic. Second, the condensation inhibiting layer 200 can include a treated surface 220 including a plurality of channels 221 to produce the minimum gravitationally energetic path to reject droplets downward. Third, the unique piezoelectric response of the condensation inhibiting layer 200 (e.g., silica polymer) can actuate the condensation inhibiting layer 200 to repel condensation off of the treated surface 220. For example, the condensation inhibiting layer 200 can be pulsed (e.g., pulsed as the door closes) via the electrode 220 to micro-atomize and displace the moisture droplets 690 vertically up and away from the condensation inhibiting layer 200 (e.g., into the free convective stream of the refrigerator interior). The collective actions of the methods and materials of the device 700 set forth above can work together to achieve condensation alleviation.

It should be noted that the condensation inhibiting layer 200 can be "pulsed" by repeatedly constricting the layer 200 for a brief period (i.e., the length of time of the voltage pulse) and relaxing the layer 200 for a brief period (e.g., the length of time between voltage pulses). The pulsed voltage can cause the condensation inhibiting layer 200 to be rapidly and repeatedly constricted and relaxed, which causes the condensation inhibiting layer 200 to vibrate which can inhibit and/or remove condensation and frost from the door 795.

A Sensor

Figure 8:
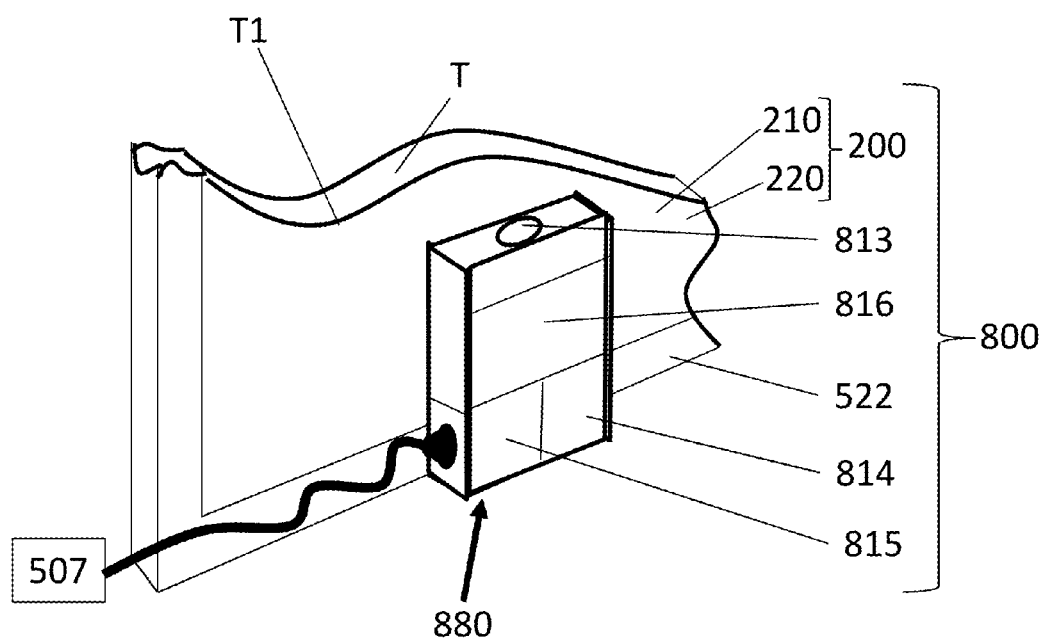
FIG. 8 illustrates a condensation inhibiting device 800 according to an exemplary aspect of the present invention.

FIG. 8 illustrates a condensation inhibiting device 800 according to an exemplary aspect of the present invention.

As illustrated in FIG. 8, the condensation inhibiting device 800 includes a condensation inhibiting layer 200, and an electrode 522 connected to the condensation inhibiting layer 200.

The condensation inhibiting device 800 can also include an electrical connector 815 connecting the condensation inhibiting device 800 to a voltage source (e.g., voltage source 507) such as a power supply (e.g., standard AC 110 V power supply). The condensation inhibiting device 800 can also include a power adapter to convert the AC voltage to a DC voltage before applying voltage across the condensation inhibiting layer 200. In addition to, or in place of the electrical connector 815, the condensation inhibiting device 800 can include a battery connection so that the condensation inhibiting device 800 can be powered by a battery (e.g., rechargeable battery).

The condensation inhibiting device 800 also includes a sensor 813 which can be powered by the same voltage source 507 used to actuate the condensation inhibiting layer 200. The sensor 813 can detect a presence of water on the surface T1 and generate a detection signal. In particular, the sensor 813 can detect the film formation of frost which reduces the transparency of the transparent member T.

The sensor 813 can be fixed to the transparent member T. In particular, the sensor 813 can be fixed to the outer periphery of the transparent member T, and more particularly, can be fixed to the electrode 522 formed on the transparent member T (e.g., formed around a periphery of the transparent member T).

Alternatively, the sensor 813 can be fixed to the device to which the transparent member T is connected. For example, where the transparent member T is a door or window of a freezer, the sensor 813 can be fixed to the frame of the door or window of the freezer.

The sensor 813 can include any type of sensing unit or detector which detects the presence of water (e.g., condensation or frost) on the surface T1. For example, the sensor 813 can include an optical sensor which detects the presence of water by detecting a decrease in transparency of the transparent member T. Alternatively, the formation of frost will change the surface dielectric constant, so the sensor 813 can include dielectric constant sensor which detects the presence of water (e.g., frost or ice) by detecting a dielectric constant of the surface T1.

The condensation inhibiting device 800 can further include a control circuit 814 (e.g., microcontroller) which controls an operation of the condensation inhibiting device 800 based on the detection signal from the sensor 813. If the detection signal indicates that the sensor 813 detects the presence of water on the surface T1, then the control circuit 814 can cause the electric current to activate the transparent electrostrictive actuator film 210 (e.g., increase the electric current to the film 210). If the detection signal indicates that the sensor 813 does not detect the presence of water on the surface T1, then the control circuit 814 can cause the electric current to be redirected away from the condensation inhibiting device 800 (e.g., decrease the electric current to the film 210).

The condensation inhibiting device 800 can also include a display unit 816 for displaying information about the operation of the condensation inhibiting device 800. The display unit 826 can also display other information such as conditions (e.g., temperature, humidity) inside the device (e.g., refrigerator, freezer) and service alerts.

As illustrated in FIG. 8, the condensation inhibiting device 800 can include a module 880 (e.g., polymer or metal case) for containing various elements of the condensation inhibiting device 800. For example, the module 880 can include the sensor 813, the control circuit 814, the electrical connector 815 and the display unit 816, and can be mounted on the transparent member T, on a frame around the periphery of the transparent member, or elsewhere in the device (e.g., refrigerator, freezer).

A Control Circuit

Figure 9:
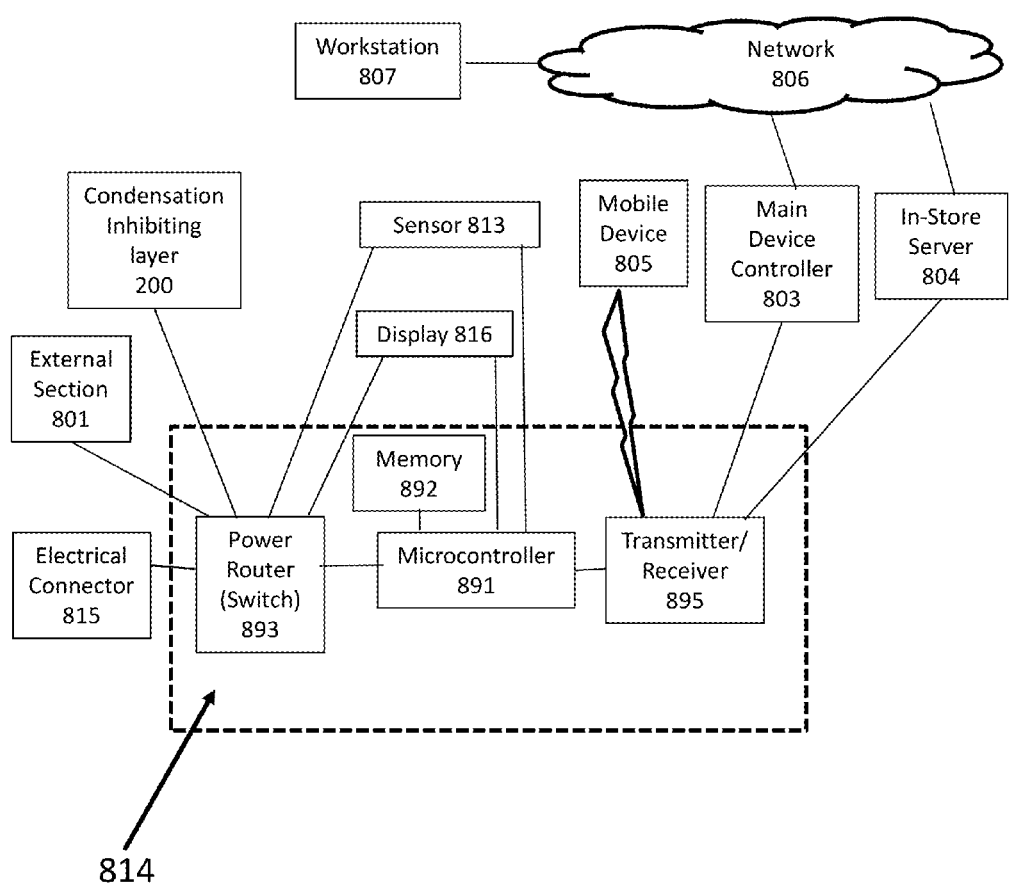
FIG. 9 illustrates a control circuit 814, according to an exemplary aspect of the present invention.

FIG. 9 illustrates the control circuit 814, according to an exemplary aspect of the present invention.

As illustrated in FIG. 9, the control circuit 814 can include a microcontroller 891 for controlling an operation of the condensation inhibiting device 800. The control circuit 814 can be connected to the electrical connector 815 and can be powered via the electrical connector 815 by the same voltage source that is used to actuate the condensation inhibiting layer 200 (e.g., voltage source 507 in FIG. 5A).

The control circuit 814 can also include a memory device 892 (e.g., random access memory (RAM)) which is accessible by the microcontroller 891 and stores operating parameters and programming algorithms for operating the condensation inhibiting device 800. Thus, the microcontroller 891 can access the memory device 892 to control an operation of the condensation inhibiting device 800.

The control circuit 814 can also include a power router 893 (e.g., switch) which is controlled by the microcontroller 891. The power router 893 can be connected to the voltage source (e.g., voltage source 507 in FIG. 5A) for actuating the condensation inhibiting layer 200, and can be controlled by the microcontroller 891 to route power from the voltage source to the condensation inhibiting layer 200, and/or to an external section 801 which is part of the device but outside of the condensation inhibiting device 800. The external section 801 of the device can include, for example, a light, fan, condenser, etc. The microcontroller 891 can also control the power router 893 to route power to the sensor 813, and to route power to the display 816.

The control circuit 814 can also use the power router 893 to provide a "pulse" of electric current to the condensation inhibiting layer 200. In particular, the control circuit 814 can apply short repeated pulses of electric current to the condensation inhibiting layer 200 in order to provide a "vibrating" effect to the condensation inhibiting layer 200 which can improve the ability of the condensation inhibiting layer 200 to repel condensation (e.g., water) and frost.

The control circuit 814 can also include a transceiver/receiver 895 for wirelessly (or by wire) communicating with a controller 803 of the device in which the control circuit 814 is operating, a server 804 (e.g., in-store server), and a mobile device 805. Thus, for example, on a particularly humid day, if a store manager identifies that condensation is forming on the doors of the store's freezers, the store manager can use his mobile device (e.g., mobile telephone) to communicate with the microcontroller 891 via the transmitter/receiver 895, in order to adjust the settings on the condensation inhibiting layer 200.

These features can enable the store manager to conveniently monitor an operation of the condensation inhibiting layer 200. For example, microcontroller 891 can cause data such as operating data (e.g., transparency of the transparent member, energy consumption, etc.) and history data (e.g., operating data over the past 30 days, over the past 6 months, etc.) to be communicated (e.g., periodically communicated) to the server 804 and stored on the server 804.

As further illustrated in FIG. 8, the control circuit 814 can be in communication with a remote workstation 807 (e.g., personal computer) via a network 806 (e.g., the Internet). This can enable data to be shared between the remote workstation 807 and the control circuit 814, and can enable the control circuit 814 to be remotely controlled by the workstation 807, and can also enable the operating parameters and programming algorithms stored in the memory device 892 to be remotely adjusted or set by the workstation 807.

The aspects of the present invention can be used, for example, in any device (e.g., aircraft, automobiles, watercraft, submarines, industrial equipment, farm equipment, refrigerators, freezers and building structures) that includes a transparent member such as a window or door.

For example, where the transparent member T is a door on a freezer, T1 can be the surface of the door facing the inside of the freezer, and T2 can be the surface of the door facing outside the freezer. On the other hand, where the transparent member T is an aircraft window, T1 can be the surface of the window facing outside the aircraft, and T2 can be the surface of the window facing inside the aircraft.

For example, it is important for a door of a freezer in a grocery store to remain transparent so that consumers can view the contents of the freezer. However, when the door is opened, moisture in the air outside of the freezer can condense on the cold inner surface of the door, reducing the transparency of the door. In this case, the condensation inhibiting device 800 can actuate the condensation inhibiting layer 200 in order to inhibit the moisture from condensing on the door and remove condensation already collected on the door.

Process for Manufacturing

Figure 10:
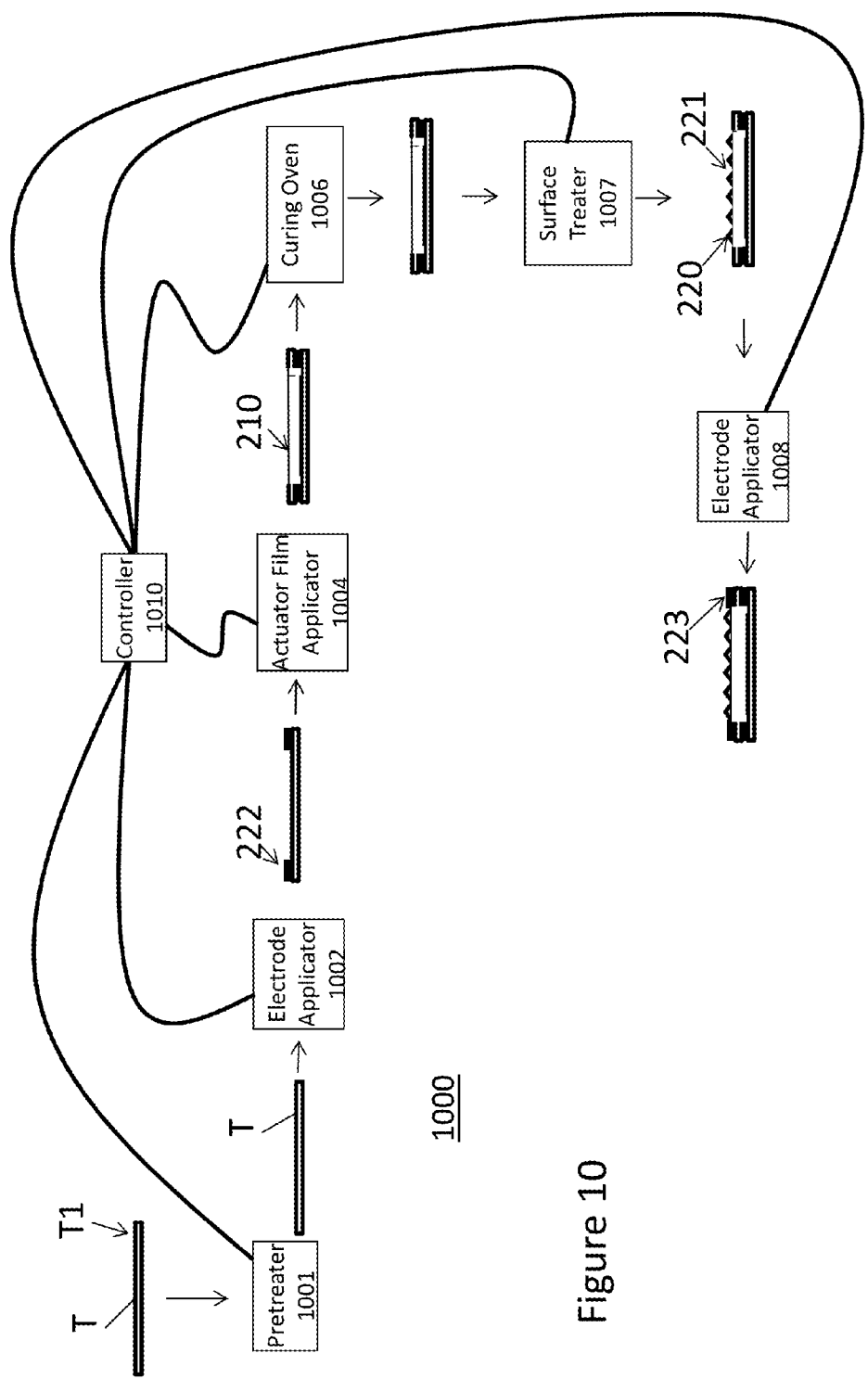
FIG. 10 illustrates a manufacturing process 1000, according to an exemplary aspect of the present invention.

FIG. 10 illustrates a manufacturing process 1000 for manufacturing a condensation inhibiting device according to an exemplary aspect of the present invention.

As illustrated in FIG. 10, the manufacturing process 1000 includes a pretreater 1001 for pretreating the transparent member T. The pretreater 1001 can, for example, clean the surface T1 to remove dirt, solvent, etc. The pretreater 1001 can also roughen the surface T1 in order to make improve the adhesiveness between the electrode 522 and the surface T1, or the adhesiveness between the electrostrictive actuator film 210 and the surface T1.

The manufacturing process 1000 also includes an electrode applicator 1002 for applying electrode 522 to the transparent member T. In one aspect, the electrode applicator 1002 presses a preformed sheet of a material of the electrode 522 (e.g., a thin sheet of polysilicon, ITO, copper and its alloys, aluminum and its alloys, gold, graphene, etc.) around the outer periphery of the transparent member T. Alternatively, the electrode applicator 1002 can deposit the material of the electrode 522 on the transparent member T, and then cure the material to form the electrode 522 around the periphery of the transparent member T. The electrode applicator 1002 can also pretreat (e.g., roughen) a surface of the electrode 522 in order to improve an adhesiveness between the electrode 522 and the electrostrictive actuator film 210.

The manufacturing process 1000 also includes an actuator film applicator 1004 for applying the electrostrictive actuator film 210 to the surface T1 and to a surface of the electrode. In one aspect, the actuator film applicator 1004 can liquid cast a material (e.g., silicone, LAG, etc.) of the electrostrictive actuator film 210. Alternatively, the actuator film applicator 1004 can apply a preformed electrostrictive actuator film 210 onto the surface T1 and onto the electrode 522 (e.g., in a peel-and-stick process), and then remove (e.g., trim) any excess electrostrictive actuator film 210 around the outer periphery of the transparent member T.

The manufacturing process 1000 can also include a curing oven 1006 for curing the liquid cast electrostrictive actuator film 210 (e.g., at a temperature in a range from about 100° C. to about 150° C.) to have a durable, hydrophobic surface. Alternatively, if a peel-and-stick process is used in the actuator film applicator 1004, then the oven 1006 can be replaced with a press machine to press the electrostrictive actuator film 210 onto the surface T1 and the electrode 522, in order to remove any air bubbles trapped under the electrostrictive actuator film 210 and smooth out the surface of the electrostrictive actuator film 210 to be uniform and flat.

The manufacturing process 1000 can also include a surface treater 1007 which can form a treated surface 220 including a plurality of channels 221 on the electrostrictive actuator film 210. The surface treater 1007 can include, for example, a laser for laser etching the electrostrictive actuator film 210 to form the plurality of channels 221. The surface treater 1007 can also include a chemically etching device for chemically etching the electrostrictive actuator film 210 to form the plurality of channels 221.

The manufacturing process 1000 can also include an electrode applicator 1008 for applying the electrode 523 onto the condensation inhibiting layer 200 (e.g., onto the treated surface 220) so that the condensation inhibiting layer 200 is formed between the electrodes 522, 523. In one aspect, the electrode applicator 1008 presses a preformed sheet of material (e.g., a thin sheet of polysilicon, ITO, copper and its alloys, aluminum and its alloys, gold, graphene, etc.) of the electrode 523 onto the condensation inhibiting layer 200 to form the electrode 523. Alternatively, the electrode applicator 1008 can deposit the material of the electrode 523 on the condensation inhibiting layer 200, and then cure the material to form the electrode 523 onto the condensation inhibiting layer 200.

The manufacturing process 1000 can also include a controller 1010 for controlling the various elements of the manufacturing process 1000, including the pretreater 1001, the electrode applicator 1002, the actuator film applicator 1004, the curing oven 1006 (or press machine), the surface treater 1007, and the electrode applicator 1008. The controller 1010 can control the elements of the manufacturing process 1000 based on a particular application of the condensation inhibiting device. For example, the controller 1010 can control the elements of the manufacturing process 1000 to have a first setting where the transparent member T is a freezer door, and to have a second setting (different from the first setting) where the transparent member T is a window for an aircraft.

It should be noted that although some of the drawings depict a condensation inhibiting device formed on a transparent member T, a non-transparent member such as a mirror can be used instead of the transparent member T.

With its unique and novel features, the present invention can provide a condensation inhibiting layer and condensation inhibiting device which can reliably attain and maintain the clarity (e.g., transparency) of a surface, and are affordable, scalable, low energy, low maintenance and outgas/discharge/contaminant free.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and device is not limited to that disclosed herein but can be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A condensation inhibiting layer, comprising:
   an electrostrictive actuator film;
   a treated surface formed on the electrostrictive actuator film, the treated surface including a plurality of channels;
   the electrostrictive actuator film includes a transparent electrostrictive actuator film which is formed on a transparent surface; and
   the plurality of channels include directional channels for directing water toward an edge of the transparent electrostrictive actuator film.

2. The condensation inhibiting layer of claim 1, wherein the transparent surface comprises a transparent door and the directional channels direct water toward an edge of the transparent electrostrictive actuator film at a bottom of the door.

3. The condensation inhibiting layer of claim 2, wherein the electrostrictive actuator film is pulsable by a voltage pulse to at least one of inhibit a condensation of water on the electrostrictive actuator film and remove condensed water on the electrostrictive actuator film, to maintain a transparency of the door.

4. The condensation inhibiting layer of claim 1, wherein the electrostrictive actuator film comprises one of an electrostrictive polymer film and a large-area graphene (LAG) film.

5. The condensation inhibiting layer of claim 1, wherein a channel of the plurality of channels comprises a depth in a range from 0.005 mm to 0.05 mm, and a width in a range from 0.05 mm to 10 mm.

6. A method of forming a condensation inhibiting layer, comprising:
   forming an electrostrictive actuator film by liquid casting a piezoelectric material onto a substrate and subjecting the piezoelectric material to infra-red light to transform the piezoelectric material into the electrostrictive actuator film, wherein the electrostrictive actuator film comprises a transparent electrostrictive actuator film, and the forming of the electrostrictive actuator film comprises forming the transparent electrostrictive actuator film on a transparent surface; and
   treating the electrostrictive actuator film to form a treated surface including a plurality of channels on the electrostrictive actuator film, wherein the plurality of channels comprise directional channels for directing water toward an edge of the electrostrictive actuator film.

7. The method of claim 6, wherein treating the electrostrictive actuator film comprises applying selected magnitude and direction laser emissions onto the electrostrictive actuator film to form the plurality of channels.

8. A condensation inhibiting device, comprising:
   a condensation inhibiting layer, comprising:
      an electrostrictive actuator film; and
      a treated surface formed on the electrostrictive actuator film, the treated surface including a plurality of channels; and
   an electrode electrically connected to the condensation inhibiting layer.

9. The condensation inhibiting device of claim 8, wherein the electrostrictive actuator film comprises a transparent electrostrictive actuator film formed on a transparent surface, and
   wherein the plurality of channels comprise directional channels of a length and orientation to direct water toward an edge of the transparent electrostrictive actuator film.

10. The condensation inhibiting device of claim 9, wherein the transparent surface comprises a transparent door and the directional channels direct water toward an edge of the transparent electrostrictive actuator film at a bottom of the door.

11. The condensation inhibiting device of claim 10, wherein the electrode is formed on the condensation inhibiting layer around a periphery of the transparent door, and receives a pulsed voltage to produce a contractive, piezoelectric constrictive response in the condensation inhibiting layer.

12. The condensation inhibiting device of claim 11, wherein the contractive, piezoelectric constrictive response in the condensation inhibiting layer at least one of inhibits a condensation of water on the electrostrictive actuator film, and removes condensed water on the electrostrictive actuator film, to maintain a transparency of the transparent door.

13. The condensation inhibiting device of claim 11, wherein the voltage source comprises a spring-loaded hinge formed on the electrode and connected via the transparent door to a door frame, the voltage source generating a pulsed voltage in response to a transition between an open door configuration to a closed door configuration.

14. The condensation inhibiting device of claim 8, further comprising:
   an air current source directed to transport moisture away from the condensation inhibiting layer.

15. The condensation inhibiting device of claim 8, further comprising:
   a sensor which detects a presence of water on the treated surface and generates a detection signal, the sensor comprising one of:
      an optical sensor which detects the presence of water by detecting a decrease in transparency of the transparent electrostrictive actuator film; and
      a dielectric constant sensor which detects the presence of water by detecting a dielectric constant of the treated surface.

16. The condensation inhibiting device of claim 15, further comprising:
   a controller for controlling an operation of the condensation inhibiting device based on the detection signal.

17. The condensation inhibiting device of claim 16, wherein if the detection signal indicates that the sensor detects the presence of water on the treated surface, then the controller causes a voltage from the electrode to actuate the condensation inhibiting layer, and
   wherein if the detection signal indicates that the sensor does not detect the presence of water on the treated surface, then the controller causes the voltage on the electrode to be redirected away from the condensation inhibiting layer.

18. The condensation inhibiting device of claim 8, wherein the electrostrictive actuator film comprises a transparent electrostrictive actuator film formed on a non-transparent surface.

19. The condensation inhibiting device of claim 18, wherein the non-transparent surface comprises a mirror surface.

20. The condensation inhibiting device of claim 8, wherein the electrostrictive actuator film comprises a preformed sheet that is applied to a surface.

21. The condensation inhibiting device of claim 11, wherein the pulsed voltage causes a vibration of the condensation inhibiting layer and the vibration at least one of:
- forces water droplets off of the condensation inhibiting layer in a direction away from the condensation inhibiting layer; and
- forces water droplets to migrate into a base of the plurality of channels for transport off of the condensation inhibiting layer.

* * * * *